(12) United States Patent
Sugimoto et al.

(10) Patent No.: US 10,906,839 B2
(45) Date of Patent: Feb. 2, 2021

(54) LOW TEMPERATURE COFIRED CERAMIC MATERIAL, CERAMIC SINTERED BODY, AND CERAMIC ELECTRONIC COMPONENT

(71) Applicant: Murata Manufacturing Co., Ltd., Nagaokakyo (JP)

(72) Inventors: Yasutaka Sugimoto, Nagaokakyo (JP); Kazuhiro Kaneko, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 399 days.

(21) Appl. No.: 15/790,267

(22) Filed: Oct. 23, 2017

(65) Prior Publication Data

US 2018/0044244 A1 Feb. 15, 2018

Related U.S. Application Data

(63) Continuation of application No. PCT/JP2016/063709, filed on May 9, 2016.

(30) Foreign Application Priority Data

May 15, 2015 (JP) ................. 2015-099654

(51) Int. Cl.
*C04B 35/195* (2006.01)
*H01B 3/12* (2006.01)
(Continued)

(52) U.S. Cl.
CPC ............ *C04B 35/195* (2013.01); *B32B 18/00* (2013.01); *C03C 3/064* (2013.01); *C03C 3/089* (2013.01);
(Continued)

(58) Field of Classification Search
None
See application file for complete search history.

(56) References Cited

U.S. PATENT DOCUMENTS 6,379,805 B1 4/2002 Oobuchi et al.
8,383,533 B2 2/2013 Katsube et al.
(Continued)

FOREIGN PATENT DOCUMENTS

JP S62-182157 A 8/1987
JP S62-226855 A 10/1987
(Continued)

OTHER PUBLICATIONS

International Search Report issued in International Application No. PCT/JP2016/063709, dated May 31, 2016.
(Continued)

*Primary Examiner* — David Sample
*Assistant Examiner* — Elizabeth Collister
(74) *Attorney, Agent, or Firm* — Arent Fox LLP

(57) ABSTRACT

A mixed powder for a low temperature cofired ceramic material that contains 65 to 80 parts by weight of $SiO_2$, 5 to 25 parts by weight of BaO, 1 to 10 parts by weight of $Al_2O_3$, 0.1 to 5 parts by weight of MnO, 0.1 to 5 parts by weight of $B_2O_3$, and 0.1 to less than 3 parts by weight of $Li_2O$. The ceramic sintered body is used for, for example, ceramic electronic components, e.g., a multilayer circuit board or a coupler.

11 Claims, 1 Drawing Sheet

(51) Int. Cl.
*C04B 35/16* (2006.01)
*H05K 1/03* (2006.01)
*B32B 18/00* (2006.01)
*C04B 35/14* (2006.01)
*C03C 3/064* (2006.01)
*C03C 3/089* (2006.01)
*C03C 14/00* (2006.01)
*C04B 35/63* (2006.01)
*C04B 35/64* (2006.01)
*H03H 7/01* (2006.01)
*H05K 1/09* (2006.01)
*H05K 1/11* (2006.01)
*H05K 3/46* (2006.01)

(52) U.S. Cl.
CPC ............ *C03C 14/004* (2013.01); *C04B 35/14* (2013.01); *C04B 35/16* (2013.01); *C04B 35/6303* (2013.01); *C04B 35/64* (2013.01); *H01B 3/12* (2013.01); *H03H 7/0138* (2013.01); *H05K 1/0306* (2013.01); *H05K 1/09* (2013.01); *H05K 1/113* (2013.01); *H05K 3/4664* (2013.01); *C04B 2235/3206* (2013.01); *C04B 2235/3215* (2013.01); *C04B 2235/3232* (2013.01); *C04B 2235/3244* (2013.01); *C04B 2235/3262* (2013.01); *C04B 2235/3418* (2013.01); *C04B 2235/3436* (2013.01); *C04B 2235/3481* (2013.01); *C04B 2235/36* (2013.01); *C04B 2235/365* (2013.01); *C04B 2235/6584* (2013.01); *C04B 2235/80* (2013.01); *C04B 2235/96* (2013.01); *C04B 2237/341* (2013.01); *C04B 2237/68* (2013.01); *H03H 7/0115* (2013.01); *H05K 3/4605* (2013.01)

(56) References Cited

U.S. PATENT DOCUMENTS

2002/0193238 A1* 12/2002 Oobuchi ................ B32B 18/00
  501/153
2011/0214908 A1*  9/2011 Kaneko ................... C03C 12/00
  174/257
2011/0284270 A1   11/2011 Katsube et al.

FOREIGN PATENT DOCUMENTS

| | | |
|---|---|---|
| JP | 2000-211989 A | 8/2000 |
| JP | 2002-29827 A | 1/2002 |
| JP | 2004-203646 A | 7/2004 |
| JP | 2006-1755 A | 1/2006 |
| JP | 4569000 B2 | 10/2010 |
| JP | 4883224 B2 | 2/2012 |

OTHER PUBLICATIONS

Written Opinion of the International Searching Authority issued in International Application No. PCT/JP2016/063709, dated May 31, 2016.

* cited by examiner

LOW TEMPERATURE COFIRED CERAMIC MATERIAL, CERAMIC SINTERED BODY, AND CERAMIC ELECTRONIC COMPONENT

CROSS REFERENCE TO RELATED APPLICATIONS

The present application is a continuation of International application No. PCT/JP2016/063709, filed May 9, 2016, which claims priority to Japanese Patent Application No. 2015-099654, filed May 15, 2015, the entire contents of each of which are incorporated herein by reference.

FIELD OF THE INVENTION

The present invention relates to a low temperature cofired ceramic material, a ceramic sintered body produced by sintering the same, and a ceramic electronic component formed by using the ceramic sintered body. In particular, the present invention relates to an improvement for the purpose of reducing the dielectric constant and enhancing the strength of a ceramic sintered body.

BACKGROUND OF THE INVENTION

Regarding electrically insulating materials for ceramic electronic components that are applied to high frequency electronic circuits, low temperature cofired ceramic (LTCC) materials, which can be cofired with low-melting-point metal materials, e.g., Ag and Cu, having relatively low resistivity, have been developed and put into practical use.

In general, ceramic sintered bodies for forming ceramic layers in electronic components, e.g., a multilayer wiring board, a coupler, and an inductor, are desired to have low dielectric constants in order to suppress delays in electric signals, electromagnetic mutual interference, and electrical losses.

Regarding materials that satisfy these needs, there is a glass-based ceramic material, in which glass containing a large amount of $SiO_2$ is added to a $SiO_2$ filler, as described in, for example, Japanese Patent No. 4569000 (Patent Document 1). The material described in Patent Document 1 realizes, by using $SiO_2$-rich glass, a low dielectric constant such that the relative dielectric constant of a sintered body thereof is 3 to 3.9.

The glass-based ceramic material described in Patent Document 1 has a poor degreasing property because the viscosity of the glass is high at a high temperature. Consequently, in general, firing is performed in the air. In that case, Ag is usually used as a conductor material to be cofired. Meanwhile, if such a glass-based ceramic material is fired in a reducing atmosphere, degreasing becomes insufficient and, consequently, the glass-based ceramic material cannot be densely sintered.

Incidentally, regarding the above-described electronic components, e.g., a multilayer wiring board, a coupler, and an inductor, it is considered that size reduction and thickness reduction will further advance in the future. Then, in order to address this, Cu has greater potential as a conductor material to be cofired compared with Ag, which has a problem in terms of reliability because of migration and the like. However, the ceramic material has to be fired in a reducing atmosphere in order to be cofired with a Cu conductor. In this regard, if the firing in a reducing atmosphere is essential, the glass-based ceramic material described in Patent Document 1 is not suitable therefor.

In addition, according to a measurement experiment performed by the present inventor, the mechanical strength of the sintered body of the ceramic material described in Patent Document 1 is 100 MPa and, therefore, is very low. Consequently, there is a concern that the reliability may be poor.

Meanwhile, for example, Japanese Patent No. 4883224 (Patent Document 2) and Japanese Unexamined Patent Application Publication No. 2002-29827 (Patent Document 3) describe low temperature cofired ceramic materials capable of being cofired with a Cu conductor in the air.

The low temperature cofired ceramic material described in Patent Document 2 contains $SiO_2$—$BaO$—$Al_2O_3$ as a primary component and a very small amount of MnO, $TiO_2$, MgO, and the like added thereto. In the low temperature cofired ceramic material described in Patent Document 3, $MgAl_2O_4$ serves as a filler and a $SiO_2$—$B_2O_3$—$Al_2O_3$—MgO-based glass powder is mixed therewith. The main crystals of the sintered bodies of the low temperature cofired ceramic materials described in Patent Documents 1 and 2 are quartz ($SiO_2$), celsian ($BaAl_2Si_2O_8$), and the like.

The ceramic sintered bodies described in Patent Documents 2 and 3 have relatively high mechanical strength.

However, according to a measurement experiment performed by the present inventor, the specific dielectric constant of the sintered body of the low temperature cofired ceramic material described in Patent Document 2 is 6.9 and, therefore, is relatively high. Also, Patent Document 3 describes a ceramic sintered body having a relatively high specific dielectric constant of about 7. Consequently, realization of a ceramic sintered body having a still lower specific dielectric constant is desired for the purpose of increasing the frequency, reducing the loss, and reducing the size of the ceramic electronic component.

Patent Document 1: Japanese Patent No. 4569000
Patent Document 2: Japanese Patent No. 4883224
Patent Document 3: Japanese Unexamined Patent Application Publication No. 2002-29827

SUMMARY OF THE INVENTION

Accordingly, it is an object of the present invention to provide a low temperature cofired ceramic material capable of solving the above-described problems, more specifically, capable of reducing the dielectric constant and enhancing the strength, a ceramic sintered body produced by sintering the same, and a ceramic electronic component formed by using the ceramic sintered body.

In order to solve the above-described problems, a mixed powder for a low temperature cofired ceramic material according to an embodiment of the present invention contains 65 to 80 parts by weight of $SiO_2$, 5 to 25 parts by weight of BaO, 1 to 10 parts by weight of $Al_2O_3$, 0.1 to 5 parts by weight of MnO, 0.1 to 5 parts by weight of $B_2O_3$, and 0.1 to less than 3 parts by weight of $Li_2O$. With such a composition, the low temperature cofired ceramic material does not substantially change due to sintering.

In the case where the composition ratio of the mixed powder for the low temperature cofired ceramic material according to an embodiment of the present invention is selected to fall within the more limited range such that the $SiO_2$ is 70 to 80 parts by weight, the BaO is 10 to 20 parts by weight, the $Al_2O_3$ is 3 to 7 parts by weight, the MnO is 2 parts by weight, the $B_2O_3$ is 2 parts by weight, and the $Li_2O$ is 0.4 parts by weight, a ceramic sintered body produced by sintering the low temperature cofired ceramic material can realize a lower specific dielectric constant and higher mechanical strength.

The composition of the mixed powder for the low temperature cofired ceramic material does not substantially change due to sintering. Therefore, a ceramic sintered body according to the present invention contains 65 to 80 parts by weight of Si, 5 to 25 parts by weight of Ba, 2 to 20 parts by weight of Al, 0.1 to 5 parts by weight of Mn, 0.2 to 10 parts by weight of B, and 0.2 to less than 6 parts by weight of Li.

In the same manner as the above-described mixed powder for the low temperature cofired ceramic material, in order to realize a lower specific dielectric constant and higher mechanical strength, the composition of the ceramic sintered body according to the present invention may be selected to fall within the more limited range such that Si is 70 to 80 parts by weight, Ba is 10 to 20 parts by weight, Al is 6 to 14 parts by weight, Mn is 2 parts by weight, B is 4 parts by weight, and Li is 0.8 parts by weight.

In a first preferred aspect, the ceramic sintered body according to an embodiment of the present invention contains glass and at least quartz ($SiO_2$) and celsian ($BaAl_2Si_2O_8$) as a crystal phase, wherein a peak intensity ratio denoted by Pq/Pc in powder X-ray diffractometry is 2.2 or more and 5.3 or less, where Pc represents the peak intensity of celsian at $2\theta(Cu-K\alpha)=13.5°$ and Pq represents the peak intensity of quartz at $2\theta(Cu-K\alpha)=50.0°$.

In a second preferred aspect, the ceramic sintered body according to an embodiment of the present invention contains glass and at least quartz ($SiO_2$) and sanbornite ($BaSi_2O_5$) as a crystal phase, wherein a peak intensity ratio denoted by Pq/Ps in powder X-ray diffractometry is 0.022 or more and 0.452 or less, where Ps represents the peak intensity of sanbornite at $2\theta(Cu-K\alpha)=28.80°$ and Pq represents the peak intensity of quartz at $2\theta(Cu-K\alpha)=50.0°$.

The ceramic sintered body according to an embodiment of the present invention is applied to a ceramic electronic component including a ceramic layer formed by using the ceramic sintered body so as to provide the above-noted advantages. Therefore, the present invention is also applied to a ceramic electronic component including a ceramic layer composed of the above-described ceramic sintered body.

Preferably, the ceramic electronic component according to an embodiment of the present invention includes a multilayer body, in which a plurality of the ceramic layers are stacked, and a conductor disposed at least one of on the surface of and inside the multilayer body. The ceramic electronic components having such a structure are, for example, a multilayer wiring board and a coupler. In this regard, preferably, the conductor contains Cu that does not easily cause problems such as migration.

As is clear from the experimental examples described later, a ceramic sintered body having a specific dielectric constant of less than 6.0 and mechanical strength of 150 MPa or more because of actions of a low dielectric constant due to quartz and high strength due to celsian or sanbornite can be produced by using the low temperature cofired ceramic material according to an embodiment of the present invention.

Also, the low temperature cofired ceramic material according to an embodiment of the present invention can be sintered in a reducing atmosphere at a temperature of 1,000° C. or lower and, therefore, can be cofired with Cu. Consequently, regarding a ceramic electronic component including a conductor containing Cu, the ceramic sintered body produced by using the low temperature cofired ceramic material is used for forming a ceramic layer so as to provide other advantages.

DETAILED DESCRIPTION OF THE PREFERRED EMBODIMENTS

Figure 1:
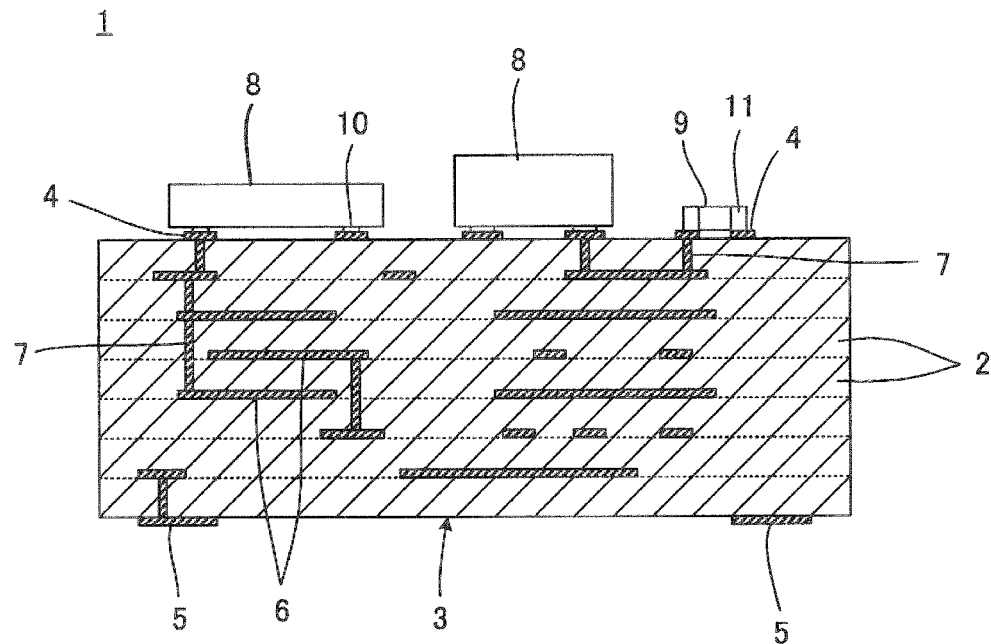
FIG. 1 is a sectional view showing a multilayer circuit board 1 as an example of a ceramic electronic component formed by using a ceramic sintered body according to an embodiment of the present invention.

A mixed powder for a low temperature cofired ceramic material according to an embodiment of the present invention contains 65 to 80 parts by weight of $SiO_2$, 5 to 25 parts by weight of BaO, 1 to 10 parts by weight of $Al_2O_3$, 0.1 to 5 parts by weight of MnO, 0.1 to 5 parts by weight of $B_2O_3$, and 0.1 to less than 3 parts by weight of $Li_2O$.

A ceramic sintered body, as described below, is produced by sintering the low temperature cofired ceramic material.

The ceramic sintered body substantially maintains the composition of the above-described ceramic material and has a composition containing 65 to 80 parts by weight of Si, 5 to 25 parts by weight of Ba, 2 to 20 parts by weight of Al, 0.1 to 5 parts by weight of Mn, 0.2 to 10 parts by weight of B, and 0.2 to less than 6 parts by weight of Li, in the same manner as in the low temperature cofired ceramic material.

As is clear from the experimental examples described later, a specific dielectric constant of less than 6.0 and a mechanical strength of 150 MPa or more can be realized because of the actions of a low dielectric constant due to quartz and high strength due to celsian or sanbornite by using the ceramic sintered body according to an embodiment of the present invention.

In the case where the composition of the mixed powder for the low temperature cofired ceramic material or the ceramic sintered body according to an embodiment of the present invention is selected to fall within a more limited range such that the $SiO_2$ is 70 to 80 parts by weight, the BaO is 10 to 20 parts by weight, the $Al_2O_3$ is 3 to 7 parts by weight, the MnO is 2 parts by weight, the $B_2O_3$ is 2 parts by weight, and the $Li_2O$ is 0.4 parts by weight, as is clear from the experimental examples described later, a ceramic sintered body can realize a lower specific dielectric constant and higher mechanical strength. For example, a specific dielectric constant of 4.1 or less and a mechanical strength of 220 MPa or more can be achieved.

In addition, the ceramic sintered body produced by sintering the low temperature cofired ceramic material includes predetermined proportions of quartz ($SiO_2$) and celsian ($BaAl_2Si_2O_8$) as a crystal phase.

Therefore, the ceramic sintered body according to an embodiment of the present invention can also be expressed from the viewpoint of the crystal phase. That is, from the viewpoint of the crystal phase, the ceramic sintered body according to an embodiment of the present invention contains glass and at least quartz and celsian as a crystal phase, wherein a peak intensity ratio denoted by Pq/Pc in powder X-ray diffractometry is 2.2 or more and 5.3 or less, where Pc represents the peak intensity of celsian at $2\theta(Cu-K\alpha)=13.5°$ and Pq represents the peak intensity of quartz at $2\theta(Cu-K\alpha)=50.0°$, as a necessary condition.

Alternatively, the ceramic sintered body produced by sintering the low temperature cofired ceramic material may include predetermined proportions of quartz ($SiO_2$) and sanbornite ($BaSi_2O_5$) as a crystal phase.

In this case, from the viewpoint of the crystal phase, the ceramic sintered body according to an embodiment of the present invention contains glass and at least quartz and sanbornite as a crystal phase, wherein a peak intensity ratio denoted by Pq/Ps in powder X-ray diffractometry is 0.022 or more and 0.452 or less, where Ps represents the peak intensity of sanbornite at $2\theta(\text{Cu-K}\alpha)=28.80°$ and Pq represents the peak intensity of quartz at $2\theta(\text{Cu-K}\alpha)=50.0°$, as a necessary condition.

The low temperature cofired ceramic material according to an embodiment of the present invention is provided by, for example, increasing the amount of quartz ($SiO_2$) in the material containing $BaO$—$Al_2O_3$—$SiO_2$—$MnO$—$ZrO_2$—$TiO_2$—$MgO$ as a primary component and adding alkali and alkaline earth borosilicate glass, e.g., Li—Ba—Sr—Ca—Mg—B—Si—O based glass, as a sintering aid. In this regard, in the above-described example, Sr, Ca, Ti, Zr, and Mg among the elements included in the low temperature cofired ceramic material are arbitrary components, and it was ascertained that substantially no influence was exerted on the characteristics when very small amounts of these components were included, as shown in the experimental example described later.

The low temperature cofired ceramic material according to an embodiment of the present invention can be sintered at a temperature of 1,000° C. or lower while the degreasing property is ensured by performing firing in even a reducing atmosphere because of crystallization of the above-described glass.

In this regard, the reasons for the limitations on the composition ratio and the crystal phase of each of the low temperature cofired ceramic material and the ceramic sintered body will be clarified by the experimental examples described later.

Next, a multilayer circuit board serving as an example of the ceramic electronic component formed by using the ceramic sintered body according to an embodiment of the present invention will be described.

As shown in FIG. 1, a multilayer circuit board 1 includes a multilayer body 3 in which a plurality of ceramic layers 2 are stacked. The ceramic layers 2 are composed of ceramic sintered bodies according to an embodiment of the present invention. In the multilayer body 3, various conductors are disposed on and in specific ceramic layers 2.

Examples of the above-described conductors include some outer conductor films 4 and 5 disposed on the end surfaces in the stacking direction of the multilayer body 3, some inner conductor films 6 disposed along specific interfaces between the ceramic layers 2, and via conductors 7 which are disposed so as to extend through specific ceramic layers 2 and which function as interlayer connection conductors.

The outer conductor films 4 disposed on the upper end surface of the multilayer body 3 are used so as to realize connections to electronic components 8 and 9 which are mounted on the outer surface of the multilayer body 3. Electronic components 8, e.g., a semiconductor device, provided with bump electrodes 10 and an electronic component 9, e.g., a chip capacitor, provided with planar terminal electrodes 11 are shown in FIG. 1. Meanwhile, the outer conductor films 5 disposed on the lower end surface of the multilayer body 3 are used so as to realize connections to a mother board (not shown in the drawing) on which the multilayer circuit board 1 is mounted.

The multilayer body 3 included in the above-described multilayer circuit board 1 is produced by firing a green multilayer body including a plurality of ceramic green layers, which are stacked and which serve as the ceramic layers 2, and the inner conductor films 6 and the via conductors 7, which are formed by using a conductor paste, and in some cases, further including the outer conductor films 4 and 5 which are formed by using the conductor paste.

The ceramic green layers in the green multilayer body contain the low temperature cofired ceramic material according to an embodiment of the present invention. Therefore, the multilayer body 3 including the ceramic layers 2 composed of the ceramic sintered body according to an embodiment of the present invention can be produced by firing the green multilayer body. Even in the case where a reducing atmosphere is applied to this firing, the ceramic material can be sintered at a temperature of 1,000° C. or lower while the degreasing property is ensured. Consequently, the conductor paste used for forming the conductors, e.g., the inner conductor films 6 and the via conductors 7 may contain Cu as a primary component.

Incidentally, the present invention is not limited to the multilayer circuit board including the multilayer body having the above-described multilayer structure and can be applied to a single-layer structure ceramic substrate including only one ceramic layer. Also, the present invention can be applied to a composite type multilayer circuit board in which the ceramic layers composed of the ceramic sintered body according to an embodiment of the present invention and other ceramic layers composed of a ceramic sintered body having a relatively high specific dielectric constant are combined.

Next, a coupler serving as another example of the ceramic electronic component formed by using the ceramic sintered body according to an embodiment of the present invention will be described.

Figure 2:
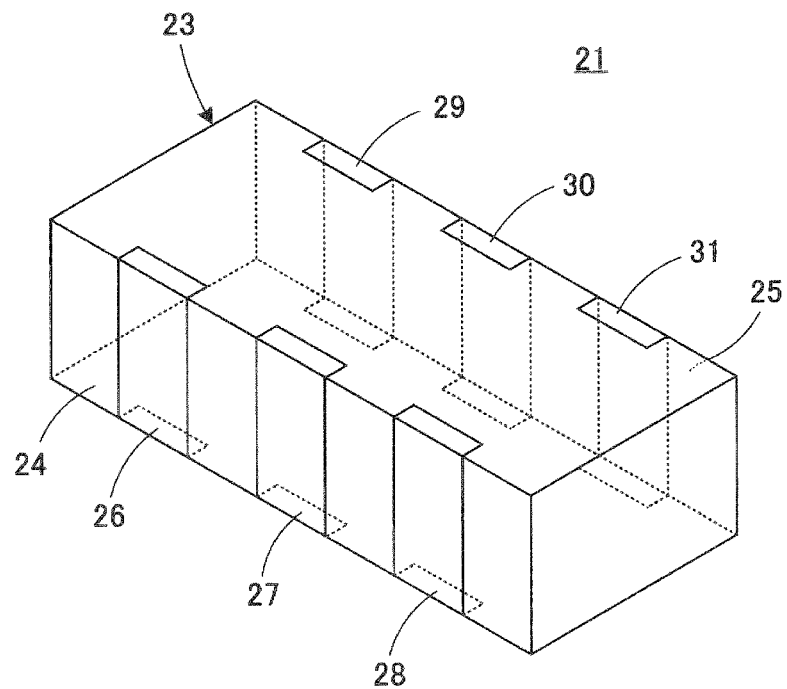
FIG. 2 is a perspective view showing the appearance of a coupler 21 as another example of the ceramic electronic component formed by using a ceramic sintered body according to an embodiment of the present invention.

As shown in FIG. 2, a coupler 21 includes a multilayer body 23 in which a plurality of ceramic layers are stacked in the same manner as in the multilayer circuit board 1. In the multilayer body 23, various conductors are disposed on and in specific ceramic layers.

Examples of the conductors include some inner conductor films disposed along specific interfaces between the ceramic layers and via conductors which are disposed so as to extend through specific ceramic layers and which function as interlayer connection conductors in the same manner as in the case of the multilayer circuit board 1. Although not shown in the drawing, wiring paths necessary for the coupler 21 and, in addition, capacitors and inductors for forming filters are provided inside the multilayer body 23 by these conductors.

Meanwhile, three outer terminal electrodes 26 to 28 are disposed on the first side surface 24 out of the side surfaces 24 and 25, which are opposite to each other, of the multilayer body 23, and three outer terminal electrodes 29 to 31 are disposed on the second side surface 25.

Among these outer terminal electrodes 26 to 31, for example, the outer terminal electrode 26 is used as an input port, and the outer terminal electrode 28 is used as an output port. Also, the outer terminal electrode 29 is used as a coupling port, and the outer terminal electrode 31 is used as a termination port that is terminated with 50Ω. The outer terminal electrodes 27 and 30 are used as grounding ports that are grounded.

In the above-described coupler 21, the ceramic layers constituting the multilayer body 23 are formed by using the ceramic sintered body according to an embodiment of the present invention. That is, the ceramic green layers in the green multilayer body before firing contain the low temperature cofired ceramic material according to an embodiment of the present invention. Therefore, the multilayer body 23 including the ceramic layers composed of the ceramic sintered body according to an embodiment of the present invention can be produced by firing the green multilayer body. Even in the case where a reducing atmosphere is applied to this firing, the ceramic material can be sintered at a temperature of 1,000° C. or lower while the degreasing property is ensured. Consequently, the conductor paste used for forming the conductors, e.g., the inner conductor films and the via conductors, may contain Cu.

Next, experimental examples that were performed so as to determine the scope of the present invention will be described.

Experimental Example 1

(Filler Raw Material and Production of Glass)

TABLE 1

| Glass symbol | SiO$_2$ | BaO | B$_2$O$_3$ | Li$_2$O | SrO | CaO | MgO |
|---|---|---|---|---|---|---|---|
| G1 | 27 | 55 | 15 | 3 | 0 | 0 | 0 |
| G2 | 15 | 67 | 15 | 3 | 0 | 0 | 0 |
| G3 | 20 | 62 | 15 | 3 | 0 | 0 | 0 |
| G4 | 45 | 37 | 15 | 3 | 0 | 0 | 0 |
| G5 | 47 | 35 | 15 | 3 | 0 | 0 | 0 |
| G6 | 72 | 15 | 15 | 3 | 0 | 0 | 0 |
| G7 | 67 | 30 | 15 | 3 | 0 | 0 | 0 |
| G8 | 12 | 70 | 15 | 3 | 0 | 0 | 0 |
| G9 | 2 | 80 | 15 | 3 | 0 | 0 | 0 |
| G10 | 32 | 65 | 0 | 3 | 0 | 0 | 0 |

TABLE 1-continued

| Glass symbol | SiO$_2$ | BaO | B$_2$O$_3$ | Li$_2$O | SrO | CaO | MgO |
|---|---|---|---|---|---|---|---|
| G11 | 30 | 66 | 1 | 3 | 0 | 0 | 0 |
| G12 | 17 | 47 | 33 | 3 | 0 | 0 | 0 |
| G13 | 13 | 40 | 44 | 3 | 0 | 0 | 0 |
| G14 | 30 | 55 | 15 | 0 | 0 | 0 | 0 |
| G15 | 26 | 58 | 15 | 0.8 | 0 | 0 | 0 |
| G16 | 27 | 53 | 15 | 11.1 | 0 | 0 | 0 |
| G17 | 27 | 48 | 15 | 12.0 | 0 | 0 | 0 |
| G18 | 27 | 52 | 15 | 3 | 3 | 0 | 0 |
| G19 | 27 | 52 | 15 | 3 | 0 | 3 | 0 |
| G20 | 27 | 52 | 15 | 3 | 0 | 0 | 3 |
| G21 | 27 | 52 | 15 | 3 | 1 | 1 | 1 |

(unit: parts by weight)

Oxides or carbonates serving as starting materials were mixed so as to have the glass composition, in terms of oxide, shown in Table 1, the mixture was put into a Pt crucible, and melting was performed for 1 hour. When the melting was performed, an appropriate temperature within the range of 1,300° C. to 1,500° C. in accordance with the glass composition was applied. Subsequently, the resulting glass melt was rapidly cooled. Thereafter, pulverization was performed so as to produce a glass powder of each of glass symbols G1 to G2 shown in Table 1.

In this regard, some of the glass powder samples shown in Table 1 were also used in experimental example 2 described later.

TABLE 2

| Sample No. | Glass Type | Glass Amount | Filler SiO$_2$ | Filler BaO | Filler Al$_2$O$_3$ | Filler MnO | Filler TiO$_2$ | Filler ZrO$_2$ | Filler MgO |
|---|---|---|---|---|---|---|---|---|---|
| 1 | G1 | 13 | 72.1 | 7.9 | 5 | 2 | 0 | 0 | 0 |
| *2 | G2 | 13 | 58.7 | 22.3 | 4 | 2 | 0 | 0 | 0 |
| 3 | G3 | 13 | 63.0 | 12.9 | 9 | 2 | 0 | 0 | 0 |
| 4 | G4 | 13 | 74.8 | 4.2 | 6 | 2 | 0 | 0 | 0 |
| *5 | G5 | 13 | 79.5 | 5.5 | 0 | 2 | 0 | 0 | 0 |
| *6 | G6 | 13 | 74.2 | 0.1 | 10 | 2 | 0 | 0 | 0 |
| 7 | G7 | 13 | 71.9 | 1.1 | 10 | 2 | 0 | 0 | 0 |
| 8 | G8 | 13 | 64.0 | 15.9 | 5 | 2 | 0 | 0 | 0 |
| *9 | G9 | 13 | 61.4 | 21.6 | 1 | 2 | 0 | 0 | 0 |
| *10 | G1 | 13 | 72.0 | 7.9 | 0 | 2 | 0 | 0 | 0 |
| 11 | G1 | 13 | 72.0 | 7.9 | 1 | 2 | 0 | 0 | 0 |
| 12 | G1 | 13 | 72.0 | 7.9 | 10 | 2 | 0 | 0 | 0 |
| *13 | G1 | 13 | 72.0 | 7.9 | 12 | 2 | 0 | 0 | 0 |
| *14 | G1 | 13 | 75.1 | 7.9 | 4 | 0 | 0 | 0 | 0 |
| 15 | G1 | 13 | 75.0 | 7.9 | 4 | 0.1 | 0 | 0 | 0 |
| 16 | G1 | 13 | 70.1 | 7.9 | 4 | 5 | 0 | 0 | 0 |
| *17 | G1 | 13 | 65.1 | 7.9 | 4 | 10 | 0 | 0 | 0 |
| *18 | G10 | 13 | 75.1 | 6.6 | 4 | 1.3 | 0 | 0 | 0 |
| 19 | G11 | 13 | 75.3 | 6.4 | 4 | 1.3 | 0 | 0 | 0 |
| 20 | G12 | 15 | 71.8 | 8.0 | 4 | 1.3 | 0 | 0 | 0 |
| *21 | G13 | 18 | 69.0 | 7.8 | 4 | 1.3 | 0 | 0 | 0 |
| *22 | G14 | 13 | 72.1 | 7.9 | 5 | 2 | 0 | 0 | 0 |
| 23 | G15 | 13 | 72.5 | 7.5 | 5 | 2 | 0 | 0 | 0 |
| 24 | G16 | 18 | 69.1 | 5.5 | 5 | 2 | 0 | 0 | 0 |
| *25 | G17 | 25 | 66.3 | 3.0 | 5 | 2 | 0 | 0 | 0 |
| 26 | G18 | 13 | 72.0 | 8.2 | 5 | 2 | 0 | 0 | 0 |
| 27 | G19 | 13 | 72.0 | 8.2 | 5 | 2 | 0 | 0 | 0 |
| 28 | G20 | 13 | 72.0 | 8.2 | 5 | 2 | 0 | 0 | 0 |
| 29 | G21 | 13 | 72.0 | 8.2 | 5 | 2 | 0 | 0 | 0 |
| 30 | G1 | 13 | 71.0 | 7.9 | 5 | 2 | 1 | 0 | 0 |
| 31 | G1 | 13 | 71.0 | 7.9 | 5 | 2 | 0 | 1 | 0 |
| 32 | G1 | 13 | 71.0 | 7.9 | 5 | 2 | 0 | 0 | 1 |
| 33 | G1 | 13 | 71.0 | 7.9 | 5 | 2 | 0.3 | 0.4 | 0.3 |
| 34 | G1 | 13 | 66.5 | 12.9 | 5.6 | 2 | 0 | 0 | 0 |
| 35 | G1 | 13 | 74.5 | 5.9 | 5 | 2 | 0 | 0 | 0 |
| 36 | G1 | 13 | 76.5 | 2.9 | 5.6 | 2 | 0 | 0 | 0 |
| 37 | G1 | 13 | 70.1 | 11.9 | 3 | 2 | 0 | 0 | 0 |
| 38 | G1 | 13 | 71.1 | 6.9 | 7 | 2 | 0 | 0 | 0 |

(unit: parts by weight)

Meanwhile, oxides shown in column "Filler" in Table 2 were weighed, mixed, and calcined in the air at 800° C. so as to produce ceramic calcined powders.

Subsequently, a mixed powder of each sample was produced by adding the glass powder shown in the column "Type" of "Glass" in Table 2, among glass powders G1 to G21 produced as described above, to the ceramic calcined powder shown in the column "Filler" described above, where the amount of addition was as shown in the column "Amount".

Table 3 shows the total amount of each oxide, which was determined on an element basis, contained in the mixed powder of each sample shown in Table 2. In Table 3, $SiO_2$, BaO, $Al_2O_3$, MnO, $B_2O_3$, and $Li_2O$, which are indispensable components, are shown in the column "Primary component" and SrO, CaO, $TiO_2$, $ZrO_2$, and MgO, which are arbitrary components and which are not added or are added in a very small amount, are shown in the column "Additional component".

Subsequently, the ceramic green sheets provided with the conductive paste films were stacked and were pressure-bonded. The resulting green multilayer body was fired in a reducing atmosphere at a temperature of 990° C.

(Evaluation)

As shown in Table 4, "sinterability", "specific dielectric constant", and "mechanical strength" of a sintered body of each sample produced through the above-described firing step were evaluated. Regarding "sinterability", the sintered body was dipped into an ink, the manner of impregnation of the sintered body with the ink was visually observed, and whether dense sintering was achieved was rated on the basis of the results thereof. In Table 4, the case of dense is indicated by "○", and the case of not dense is indicated by "x". The sample having "sinterability" rated as "x" was not subjected to the measurement of "specific dielectric constant" and "mechanical strength". Regarding "mechanical strength", the flexural strength was measured by three-point bending.

TABLE 3

| Sample | Primary component | | | | | | Additional component | | | | |
|---|---|---|---|---|---|---|---|---|---|---|---|
| No. | $SiO_2$ | BaO | $Al_2O_3$ | MnO | $B_2O_3$ | $Li_2O$ | SrO | CaO | $TiO_2$ | $ZrO_2$ | MgO |
| 1 | 75.6 | 15 | 5 | 2 | 2 | 0.4 | 0 | 0 | 0 | 0 | 0 |
| *2 | 60.6 | 31 | 4 | 2 | 2 | 0.4 | 0 | 0 | 0 | 0 | 0 |
| 3 | 65.6 | 21 | 9 | 2 | 2 | 0.4 | 0 | 0 | 0 | 0 | 0 |
| 4 | 80.6 | 9 | 6 | 2 | 2 | 0.4 | 0 | 0 | 0 | 0 | 0 |
| *5 | 85.6 | 10 | 0 | 2 | 2 | 0.4 | 0 | 0 | 0 | 0 | 0 |
| *6 | 83.6 | 2 | 10 | 2 | 2 | 0.4 | 0 | 0 | 0 | 0 | 0 |
| 7 | 80.6 | 5 | 10 | 2 | 2 | 0.4 | 0 | 0 | 0 | 0 | 0 |
| 8 | 65.6 | 25 | 5 | 2 | 2 | 0.4 | 0 | 0 | 0 | 0 | 0 |
| *9 | 65.6 | 30 | 1 | 2 | 1 | 0.4 | 0 | 0 | 0 | 0 | 0 |
| *10 | 80.6 | 15 | 0 | 2 | 2 | 0.4 | 0 | 0 | 0 | 0 | 0 |
| 11 | 79.6 | 15 | 1 | 2 | 2 | 0.4 | 0 | 0 | 0 | 0 | 0 |
| 12 | 70.6 | 15 | 10 | 2 | 2 | 0.4 | 0 | 0 | 0 | 0 | 0 |
| *13 | 68.6 | 15 | 12 | 2 | 2 | 0.4 | 0 | 0 | 0 | 0 | 0 |
| *14 | 78.6 | 15 | 4 | 0 | 2 | 0.4 | 0 | 0 | 0 | 0 | 0 |
| 15 | 78.5 | 15 | 4 | 0.1 | 2 | 0.4 | 0 | 0 | 0 | 0 | 0 |
| 16 | 73.6 | 15 | 4 | 5 | 2 | 0.4 | 0 | 0 | 0 | 0 | 0 |
| *17 | 68.6 | 15 | 4 | 10 | 2 | 0.4 | 0 | 0 | 0 | 0 | 0 |
| *18 | 79.3 | 15 | 4 | 1.3 | 0 | 0.4 | 0 | 0 | 0 | 0 | 0 |
| 19 | 79.2 | 15 | 4 | 1.3 | 0.1 | 0.4 | 0 | 0 | 0 | 0 | 0 |
| 20 | 74.3 | 15 | 4 | 1.3 | 5 | 0.4 | 0 | 0 | 0 | 0 | 0 |
| *21 | 71.3 | 15 | 4 | 1.3 | 8 | 0.4 | 0 | 0 | 0 | 0 | 0 |
| *22 | 76 | 15 | 5 | 2 | 2 | 0 | 0 | 0 | 0 | 0 | 0 |
| 23 | 75.9 | 15 | 5 | 2 | 2 | 0.1 | 0 | 0 | 0 | 0 | 0 |
| 24 | 74 | 15 | 5 | 2 | 2.7 | 2 | 0 | 0 | 0 | 0 | 0 |
| *25 | 73 | 15 | 5 | 2 | 3.8 | 3 | 0 | 0 | 0 | 0 | 0 |
| 26 | 75.6 | 15 | 5 | 2 | 2 | 0.4 | 0.39 | 0.00 | 0.00 | 0.00 | 0.00 |
| 27 | 75.6 | 15 | 5 | 2 | 2 | 0.4 | 0.00 | 0.39 | 0.00 | 0.00 | 0.00 |
| 28 | 75.6 | 15 | 5 | 2 | 2 | 0.4 | 0.00 | 0.00 | 0.00 | 0.00 | 0.39 |
| 29 | 75.6 | 15 | 5 | 2 | 2 | 0.4 | 0.13 | 0.13 | 0.00 | 0.00 | 0.13 |
| 30 | 74.5 | 15 | 5 | 2 | 2 | 0.4 | 0.00 | 0.00 | 1.00 | 0.00 | 0.00 |
| 31 | 74.5 | 15 | 5 | 2 | 2 | 0.4 | 0.00 | 0.00 | 0.00 | 1.00 | 0.00 |
| 32 | 74.5 | 15 | 5 | 2 | 2 | 0.4 | 0.00 | 0.00 | 0.00 | 0.00 | 1.00 |
| 33 | 74.5 | 15 | 5 | 2 | 2 | 0.4 | 0.00 | 0.00 | 0.30 | 0.40 | 0.30 |
| 34 | 70 | 20 | 5.6 | 2 | 2 | 0.4 | 0 | 0 | 0 | 0 | 0 |
| 35 | 78 | 13 | 5 | 2 | 2 | 0.4 | 0 | 0 | 0 | 0 | 0 |
| 36 | 80 | 10 | 5.6 | 2 | 2 | 0.4 | 0 | 0 | 0 | 0 | 0 |
| 37 | 73.6 | 19 | 3 | 2 | 2 | 0.4 | 0 | 0 | 0 | 0 | 0 |
| 38 | 74.6 | 14 | 7 | 2 | 2 | 0.4 | 0 | 0 | 0 | 0 | 0 |

(unit: parts by weight)

(Production of Green Sheet)

Then, ceramic green sheets were produced by adding a solvent, a binder, and a plasticizer to the mixed powder of each sample shown in Table 2 and Table 3, performing mixing sufficiently, and applying a doctor blade method.

(Firing and Cofiring)

Thereafter, the ceramic green sheets were printed with a conductive paste containing Cu as a conductive component so as to form conductive paste films serving as electrodes.

In addition, the sintered body of each sample was pulverized, and powder X-ray diffraction was measured by using the resulting powder. The measurement of the powder X-ray diffraction was performed by using "RINT2000" (produced by JEOL) as an X-ray diffractometer and using 40 kV and 300 mA of Cu-Kα ray as the X-ray under the condition of scanning speed 2θ: 8°/min and room temperature: 25° C.

As a result of the powder X-ray diffractometry, it was ascertained that the sintered body contained at least quartz ($SiO_2$) and celsian ($BaAl_2Si_2O_8$).

The peak intensity (height) of celsian at $2\theta(Cu-K\alpha)=13.5°$ and the peak intensity (height) of quartz at $2\theta(Cu-K\alpha)=50.0°$ were determined from the resulting X-ray diffraction pattern. In Table 4, the peak intensity of celsian is shown in the column "Pc", and the peak intensity of quartz is shown in the column "Pq". Also, the peak intensity ratio denoted by Pq/Pc was determined and this is shown in the column "Peak intensity ratio Pq/Pc" in Table 4.

TABLE 4

| Sample No. | Peak intensity Pc | Peak intensity Pq | Peak intensity ratio Pq/Pc | Sinter-ability | Dielectric constant | Mechanical strength [MPa] |
|---|---|---|---|---|---|---|
| 1 | 1000 | 3800 | 3.8 | ○ | 5.0 | 250 |
| *2 | 1500 | 2600 | 1.7 | ○ | 6.3 | 180 |
| 3 | 1500 | 3300 | 2.2 | ○ | 5.9 | 200 |
| 4 | 600 | 3200 | 5.3 | ○ | 4.7 | 190 |
| *5 | 0 | 3300 | — | x | — | — |
| *6 | 100 | 700 | 6.9 | x | — | — |
| 7 | 300 | 1600 | 5.3 | ○ | 4.8 | 180 |
| 8 | 1300 | 2800 | 2.2 | ○ | 5.8 | 180 |
| *9 | 200 | 300 | 1.5 | ○ | 6.5 | 140 |
| *10 | 0 | 2000 | — | ○ | 4.9 | 130 |
| 11 | 200 | 1000 | 4.9 | ○ | 5.0 | 170 |
| 12 | 900 | 2500 | 2.8 | ○ | 5.8 | 250 |
| *13 | 1200 | 1800 | 1.5 | ○ | 6.3 | 260 |
| *14 | 900 | 3700 | 4.1 | x | — | — |
| 15 | 1000 | 4100 | 4.1 | ○ | 5.1 | 170 |
| 16 | 1100 | 4200 | 3.8 | ○ | 5.3 | 180 |
| *17 | 1200 | 2000 | 1.7 | ○ | 6.0 | 160 |
| *18 | 700 | 2900 | 4.1 | x | — | — |
| 19 | 800 | 3300 | 4.1 | ○ | 4.9 | 160 |
| 20 | 1000 | 3900 | 3.9 | ○ | 5.5 | 160 |
| *21 | 1200 | 4500 | 3.7 | x | — | — |
| *22 | 400 | 1500 | 3.8 | x | — | — |
| 23 | 600 | 2300 | 3.8 | ○ | 4.9 | 150 |
| 24 | 900 | 3300 | 3.7 | ○ | 5.5 | 200 |
| *25 | 700 | 2500 | 3.6 | x | — | — |
| 26 | 1000 | 3800 | 3.8 | ○ | 5.1 | 250 |
| 27 | 900 | 3300 | 3.7 | ○ | 5.0 | 260 |
| 28 | 1200 | 4600 | 3.8 | ○ | 5.2 | 240 |
| 29 | 1000 | 3900 | 3.9 | ○ | 4.9 | 240 |
| 30 | 800 | 3200 | 4.0 | ○ | 5.0 | 260 |
| 31 | 1100 | 4500 | 4.1 | ○ | 4.9 | 250 |
| 32 | 1200 | 4600 | 3.8 | ○ | 5.2 | 230 |
| 33 | 1000 | 3900 | 3.9 | ○ | 5.0 | 250 |
| 34 | 1100 | 3900 | 3.5 | ○ | 4.1 | 270 |
| 35 | 1100 | 4500 | 4.1 | ○ | 3.9 | 230 |
| 36 | 900 | 4100 | 4.5 | ○ | 3.8 | 220 |
| 37 | 800 | 3000 | 3.7 | ○ | 4.0 | 250 |
| 38 | 700 | 2500 | 3.6 | ○ | 4.0 | 260 |

In Table 4 and Tables 2 and 3 described above, asterisked sample numbers indicate samples which are out of the scope of the present invention. That is, in Table 4, the sample that falls within any one of "sinterability" of "x", "specific dielectric constant" of 6.0 or more, and "mechanical strength" of less than 150 MPa was assumed to be out of the scope of the present invention.

The samples within the scope of the present invention, that is, samples 1, 3, 4, 7, 8, 11, 12, 15, 16, 19, 20, 23, 24, and 26 to 38, satisfy the conditions such as "sinterability" of "○", "specific dielectric constant" of less than 6.0, and "mechanical strength" of 150 MPa or more. As is clear from Table 4, "peak intensity ratio Pq/Pc" of the sample within the scope of the present invention is 2.2 or more and 5.3 or less. Also, as shown in Table 3, the sample within the scope of the present invention satisfies the conditions that "$SiO_2$" is 65 to 80 parts by weight, "BaO" is 5 to 25 parts by weight, "$Al_2O_3$" is 1 to 10 parts by weight, "MnO" is 0.1 to 5 parts by weight, "$B_2O_3$" is 0.1 to 5 parts by weight, and "$Li_2O$" is 0.1 to less than 3 parts by weight.

In particular, as shown in Table 3, samples 34 to 38 have more limited compositions such that "$SiO_2$" is 70 to 80 parts by weight, "BaO" is 10 to 20 parts by weight, "$Al_2O_3$" is 3 to 7 parts by weight, "MnO" is 2 parts by weight, "$B_2O_3$" is 2 parts by weight, and "$Li_2O$" is 0.4 parts by weight. According to samples 34 to 38, as is clear from Table 4, a lower specific dielectric constant and higher mechanical strength, for example, a specific dielectric constant of 4.1 or less and mechanical strength of 220 MPa or more, can be realized.

On the other hand, regarding sample 2 out of the scope of the present invention, "$SiO_2$" shown in Table 3 was less than 65 parts by weight, "BaO" was more than 25 parts by weight, and "peak intensity ratio Pq/Pc" shown in Table 4 was less than 2.2. As a result, "specific dielectric constant" was 6.0 or more.

Regarding sample 5 out of the scope of the present invention, "$SiO_2$" was more than 80 parts by weight, evaluation of "peak intensity ratio Pq/Pc" was impossible, and "sinterability" was "x".

Regarding sample 6 out of the scope of the present invention, "$SiO_2$" was more than 80 parts by weight, "BaO" was less than 5 parts by weight, and "peak intensity ratio Pq/Pc" was more than 5.3. As a result, "sinterability" was "x".

Regarding sample 9 out of the scope of the present invention, "BaO" was more than 25 parts by weight and "peak intensity ratio Pq/Pc" was less than 2.2. As a result, "specific dielectric constant" was 6.0 or more and "mechanical strength" was less than 150 MPa.

Regarding sample 10 out of the scope of the present invention, "$Al_2O_3$" was less than 1 part by weight, and evaluation of "peak intensity ratio Pq/Pc" was impossible. As a result, "mechanical strength" was less than 150 MPa.

Regarding sample 13 out of the scope of the present invention, "$Al_2O_3$" was more than 10 parts by weight and "peak intensity ratio Pq/Pc" was less than 2.2. As a result, "specific dielectric constant" was 6.0 or more.

Regarding sample 14 out of the scope of the present invention, "MnO" was less than 0.1 parts by weight. As a result, "sinterability" was "x".

Regarding sample 17 out of the scope of the present invention, "MnO" was more than 5 parts by weight and "peak intensity ratio Pq/Pc" was less than 2.2. As a result, "specific dielectric constant" was 6.0 or more.

Regarding sample 18 out of the scope of the present invention, "$B_2O_3$" was less than 0.1 parts by weight. As a result, "sinterability" was "x".

Regarding sample 21 out of the scope of the present invention, "$B_2O_3$" was more than 5 parts by weight. As a result, "sinterability" was "x".

Regarding sample 22 out of the scope of the present invention, "$Li_2O$" was less than 0.1 parts by weight. As a result, "sinterability" was "x".

Regarding sample 25 out of the scope of the present invention, "$Li_2O$" was 3 parts by weight or more. As a result, "sinterability" was "x".

Incidentally, in the above-described experimental examples, "sinterability", "specific dielectric constant", "mechanical strength", and "peak intensity ratio Pq/Pc" were considered on the basis of the composition ratios of the ceramic materials prepared as the starting materials shown in Table 2 and Table 3. In this regard, the components of the solution obtained by subjecting the ceramic sintered body, which was produced by sintering the above-described ceramic material, to dissolution treatment were analyzed and, as a result, it was ascertained that the sintered bodies after firing had substantially the same compositions as the compositions of the ceramic materials before firing.

Meanwhile, samples 26 to 33 contained a very small amount of at least one of SrO, CaO, $TiO_2$, $ZrO_2$, and MgO as an additional component. As is clear from comparisons with the samples that did not contain these components, addition of a very small amount of these components had substantially no influence on the characteristics.

Experimental Example 2

(Filler Raw Material and Production of Glass)

TABLE 5

| Sample No. | Glass type | Amount | SiO$_2$ | BaO | Al$_2$O$_3$ | Filler MnO | TiO$_2$ | ZrO$_2$ | MgO | Firing oxygen concentration |
|---|---|---|---|---|---|---|---|---|---|---|
| *39 | G6 | 13 | 74.2 | 0.1 | 10 | 2 | 0 | 0 | 0 | 1.5E−8 |
| 40 | G1 | 13 | 72.1 | 7.9 | 5 | 2 | 0 | 0 | 0 | 1.5E−15 |
| 41 | G1 | 13 | 72.0 | 7.9 | 10 | 2 | 0 | 0 | 0 | 1.5E−11 |
| *42 | G9 | 13 | 61.4 | 21.6 | 1 | 2 | 0 | 0 | 0 | 1.5E−17 |
| 43 | G18 | 13 | 72.0 | 8.2 | 5.0 | 2 | 0 | 0 | 0 | 1.5E−13 |
| *44 | G8 | 13 | 64.0 | 15.9 | 5 | 2 | 0 | 0 | 0 | 1.5E−17 |

In the same manner as in experimental example 1, oxides shown in column "Filler" in Table 5 were weighed, mixed, and calcined in the air at 800° C. so as to produce ceramic calcined powders.

Subsequently, a mixed powder of each sample was produced by adding the glass powder shown in the column "Type" of "Glass" in Table 5, among glass powders G1 to G21 shown in Table 1, to the ceramic calcined powder shown in the column "Filler" described above, where the amount of addition was as shown in the column "Amount".

(Production of Green Sheet)

Then, ceramic green sheets were produced by adding a solvent, a binder, and a plasticizer to the mixed powder of each sample shown in Table 5, performing mixing sufficiently, and applying a doctor blade method.

(Firing and Cofiring)

Thereafter, the ceramic green sheets were printed with a conductive paste containing Cu as a conductive component so as to form conductive paste films serving as electrodes.

Subsequently, the ceramic green sheets provided with the conductive paste films were stacked and were pressure-bonded. The resulting green multilayer body was fired in a reducing atmosphere at a temperature of 990° C. The oxygen partial pressure of the atmosphere in a firing furnace during firing was measured by a $ZrO_2$ sensor and is shown in the column "Firing oxygen concentration" in Table 5.

(Evaluation)

As shown in Table 6, "sinterability", "specific dielectric constant", and "mechanical strength" of a sintered body of each sample produced through the above-described firing step were evaluated in the same manner as in experimental example 1 and are expressed in the same manner as in experimental example 1.

In addition, the sintered body of each sample was pulverized, and powder X-ray diffraction was measured by using the resulting powder under the same condition as in experimental example 1.

As a result of the powder X-ray diffractometry, it was ascertained that quartz ($SiO_2$), celsian ($BaAl_2Si_2O_8$), and sanbornite ($BaSi_2O_5$) were included.

The peak intensity (height) of sanbornite at 2θ(Cu-Kα)= 28.80° and the peak intensity (height) of quartz at 2θ(Cu-Kα)=50.0° were determined from the resulting X-ray diffraction pattern. In Table 6, the peak intensity of sanbornite is shown in the column "Ps", and the peak intensity of quartz is shown in the column "Pq". Also, the peak intensity ratio denoted by Pq/Ps was determined and this is shown in the column "Peak intensity ratio Pq/Ps" in Table 6.

TABLE 6

| Sample No. | Peak intensity Ps | Peak intensity Pq | Peak intensity ratio Pq/Ps | Sinter-ability | Dielectric constant | Mechanical strength [MPa] |
|---|---|---|---|---|---|---|
| *39 | 40 | 4500 | 0.009 | x | — | — |
| 40 | 1900 | 4200 | 0.452 | ○ | 4.9 | 250 |
| 41 | 100 | 4500 | 0.022 | ○ | 5.4 | 230 |
| *42 | 2500 | 4100 | 0.610 | ○ | 4.6 | 120 |
| 43 | 1000 | 4400 | 0.227 | ○ | 4.9 | 250 |
| *44 | 2000 | 4400 | 0.455 | ○ | 6.5 | 230 |

In Table 6 and Table 5 described above, asterisked sample numbers indicate samples which are out of the scope of the present invention. That is, in Table 6, the sample that falls within any one of "sinterability" of "x", "specific dielectric constant" of 6.0 or more, and "mechanical strength" of less than 150 MPa was assumed to be out of the scope of the present invention.

The samples within the scope of the present invention, that is, samples 40, 41, and 43, satisfy the conditions such as "sinterability" of "○", "specific dielectric constant" of less than 6.0, and "mechanical strength" of 150 MPa or more. As is clear from Table 6, "peak intensity ratio Pq/Ps" of the sample within the scope of the present invention is 0.022 or more and 0.452 or less.

Also, regarding the samples within the scope of the present invention, the total amount of each oxide, which was determined on an element basis, contained in the mixed powder of each sample shown in Table 5 satisfies the conditions that "$SiO_2$" is 65 parts by weight or more and 80 parts by weight or less, "BaO" is 5 parts by weight or more and 25 parts by weight or less, "$Al_2O_3$" is 1 part by weight or more and 10 parts by weight or less, "MnO" is 0.1 parts by weight or more and 5 parts by weight or less, "$B_2O_3$" is 0.1 parts by weight or more and 5 parts by weight or less, and "$Li_2O$" is 0.1 parts by weight or more and less than 3 parts by weight.

On the other hand, regarding sample 39 out of the scope of the present invention, "peak intensity ratio Pq/Ps" shown in Table 6 was less than 0.022, and "sinterability" was "x".

Regarding each of samples 42 and 44 out of the scope of the present invention, "peak intensity ratio Pq/Ps" was more than 0.452.

REFERENCE SIGNS LIST 1 multilayer circuit board
2 ceramic layer
3, 23 multilayer body
4, 5 outer conductor film
6 inner conductor film
7 via conductor
26 to 31 outer terminal electrode

The invention claimed is:

1. A mixed powder for producing a ceramic material, the mixed powder comprising:
    65 to 80 parts by weight of $SiO_2$;
    5 to 25 parts by weight of BaO;
    1 to 10 parts by weight of $Al_2O_3$;
    0.1 to 5 parts by weight of MnO;
    0.1 to 5 parts by weight of $B_2O_3$; and
    0.1 to less than 3 parts by weight of $Li_2O$.

2. The mixed powder for producing a ceramic material according to claim 1, wherein:
    the $SiO_2$ is 70 to 80 parts by weight;
    the BaO is 10 to 20 parts by weight;
    the $Al_2O_3$ is 3 to 7 parts by weight;
    the MnO is 2 parts by weight;
    the $B_2O_3$ is 2 parts by weight; and
    the $Li_2O$ is 0.4 parts by weight.

3. A ceramic sintered body comprising:
    65 to 80 parts by weight of Si from $SiO_2$;
    5 to 25 parts by weight of Ba from BaO;
    2 to 20 parts by weight of Al from $Al_2O_3$;
    0.1 to 5 parts by weight of Mn from MnO;
    0.2 to 10 parts by weight of B from $B_2O_3$;
    and 0.2 to less than 6 parts by weight of Li from $Li_2O$.

4. The ceramic sintered body according to claim 3, wherein:
    the Si from $SiO_2$ is 70 to 80 parts by weight;
    the Ba from BaO is 10 to 20 parts by weight;
    the Al from $Al_2O_3$ is 6 to 14 parts by weight;
    the Mn from MnO is 2 parts by weight;
    the B from $B_2O_3$ is 4 parts by weight;
    and the Li from $Li_2O$ is 0.8 parts by weight.

5. The ceramic sintered body according to claim 3, wherein the Si, Ba, Al, Mn, B and Li are in the form of:
    glass and at least quartz ($SiO_2$) and celsian ($BaAl_2Si_2O_8$) as a crystal phase,
    wherein a peak intensity ratio denoted by Pq/Pc in powder X-ray diffractometry is 2.2 or more and 5.3 or less, where Pc represents the peak intensity of celsian at $2\theta(Cu-K\alpha)=13.5°$ and Pq represents the peak intensity of quartz at $2\theta(Cu-K\alpha)=50.0°$.

6. The ceramic sintered body according to claim 3, wherein the Si, Ba, Al, Mn, B and Li are in the form of:
    glass and at least quartz ($SiO_2$) and sanbornite ($BaSi_2O_5$) as a crystal phase,
    wherein a peak intensity ratio denoted by Pq/Ps in powder X-ray diffractometry is 0.022 or more and 0.452 or less, where Ps represents the peak intensity of sanbornite at $2\theta(Cu-K\alpha)=28.80°$ and Pq represents the peak intensity of quartz at $2\theta(Cu-K\alpha)=50.0°$.

7. A ceramic electronic component comprising:
    a ceramic layer composed of the ceramic sintered body according to claim 3.

8. The ceramic electronic component according to claim 7, comprising:
    a multilayer body, in which a plurality of the ceramic layers are stacked, and a conductor disposed at least one of on the surface of and inside the multilayer body.

9. The ceramic electronic component according to claim 8, wherein the ceramic electronic component is a multilayer wiring board.

10. The ceramic electronic component according to claim 8, wherein the ceramic electronic component is a coupler.

11. The ceramic electronic component according to claim 8, wherein the conductor contains Cu.

* * * * *